US 6,670,539 B2

(12) United States Patent
Heremans et al.

(10) Patent No.: US 6,670,539 B2
(45) Date of Patent: Dec. 30, 2003

(54) ENHANCED THERMOELECTRIC POWER IN BISMUTH NANOCOMPOSITES

(75) Inventors: Joseph Pierre Heremans, Troy, MI (US); Christopher Mark Thrush, Shelby Township, Macomb County, MI (US); Donald T. Morelli, White Lake, MI (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/143,525

(22) Filed: May 9, 2002

(65) Prior Publication Data

US 2002/0170590 A1 Nov. 21, 2002

Related U.S. Application Data

(60) Provisional application No. 60/291,537, filed on May 16, 2001.

(51) Int. Cl.[7] ............................................. H01L 35/18
(52) U.S. Cl. ................. 136/240; 136/236.1; 428/689; 428/702; 428/446; 257/14; 257/414; 257/467
(58) Field of Search ...................... 136/240, 236.1; 428/689, 702, 446; 257/14, 414, 467

(56) References Cited

U.S. PATENT DOCUMENTS

| 6,159,831 A | 12/2000 | Thrush et al. ............ 438/582 |
|---|---|---|
| 6,187,165 B1 * | 2/2001 | Chien et al. ............... 205/118 |
| 6,231,744 B1 * | 5/2001 | Ying et al. ................. 205/324 |
| 6,359,288 B1 | 3/2002 | Ying et al. ................. 257/14 |
| 6,465,132 B1 * | 10/2002 | Jin ........................... 429/231.8 |
| 6,547,944 B2 | 4/2003 | Schreiber et al. ........... 205/96 |
| 2001/0051367 A1 * | 12/2001 | Kiang ........................ 435/182 |
| 2002/0055239 A1 * | 5/2002 | Tuominen et al. .......... 438/466 |

OTHER PUBLICATIONS

VYCOR® Brand Porous Glass 7930, Corning Incorporated, Corning NY 14831, (2001).

(List continued on next page.)

*Primary Examiner*—Alan Diamond
(74) *Attorney, Agent, or Firm*—Patrick M. Griffin

(57) ABSTRACT

A thermoelectric material that exhibits enhanced thermoelectric power, and thus an improvement in the thermoelectric figure of merit. Bismuth, as elemental bismuth, a bismuth alloy, a bismuth intermetallic compound, a mixture of these, or any of these including a dopant, is embedded in the pores of a host material having an average pore size in the range of about 5–15 nm. A method of making a composite thermoelectric material is also provided in which a porous host material is provided having an average pore size of about 5–15 nm, and a vapor of a bismuth-based material is caused to flow into the pores from a vapor inlet side of the host material to a vapor outlet side. The host material is then cooled from the vapor outlet side to progressively condense the vapor in the holes in the direction from the outlet side to the inlet side to progressively form nanowires of the bismuth-based material in the pores.

24 Claims, 5 Drawing Sheets

OTHER PUBLICATIONS

Elmer, "Porous and Reconstructed Glasses," Corning Inc., Engineered Materials Handbook®, vol. 4: Ceramics and Glasses, pp 427–32, (1992) ASM International.

Heremans et al, "Thermoelectric power of bismuth nanowires," vol. 59, No. 19, Physical Review B, May 15, 1999–I, The American Physical Society.

Heremans et al, "Bismuth nanowire arrays: Synthesis and galvanomagnetic properties," vol. 61, No. 4, Physical Review B, Jan. 15, 2000–II, The American Physical Society.

Zhang et al, "Electronic transport properties of single–crystal bismuth nanowire arrays," vol. 61, No. 7, Physical Review B, Feb. 15, 2000–I, The American Physical Society.

Hicks et al, "Thermoelectric figure of merit of a one–dimensional conductor," vol. 47, No. 24, Jun. 15, 1993–II, The American Physical Society.

Lin et al, "Transport properties of Bi nanowire arrays," vol. 76, No. 26, Applied Physics Letters, Jun. 26, 2000, 2000 American Institute of Physics.

Abrikosov, "Fundamentals of the Theory of Metals," North–Holland, 1988, Sections 11.3; 11.4; 11.5 11.6; 11.7.

Edited by D.M. Rowe, CRC Handbook of Thermoelectrics, CRC Press, 1995, pp 211–255.

Heremans et al, "Magnetoresistance of bismuth nanowire arrays: A possible transition from one–dimensional to three–dimensional localization," Physial Review B, Third Series, vol. 58, No. 16 Oct. 15, 1998–II, 1998 The American Physical Society.

Heremans, "Thermal Transport in bismuth nanowires," Thermal Conductivity 25–Thermal Expansion 13—Jun. 13–16, 1999, pp 114–121.

* cited by examiner

ENHANCED THERMOELECTRIC POWER IN BISMUTH NANOCOMPOSITES

CROSS REFERENCE TO RELATED APPLICATION

Pursuant to 37 C.F.R. §1.78(a)(4), this application claims the benefit of and priority to prior filed co-pending U.S. Provisional Application Serial No. 60/291,537, filed May 16, 2001, which is expressly incorporated herein by reference.

FIELD OF THE INVENTION

This invention relates to thermoelectric materials, and more specifically to bismuth nanocomposites exhibiting enhanced thermoelectric power.

BACKGROUND OF THE INVENTION

Sub-ambient cooling is conventionally accomplished through gas/liquid vapor phase compression based refrigeration cycles using freon-type refrigerants to implement the heat transfers. Such refrigeration systems are used extensively for cooling human residences, foods, and vehicles. Sub-ambient cooling is also often used with major electronic systems such as mainframe server and workstation computers.

In 1974, it was first suggested that chlorofluorocarbon compounds, principally freon (R-12), the refrigerant of choice in air conditioning systems for the last 50 years, were destroying the protective ozone layer in the stratosphere at an alarming rate. The Montreal Protocol of 1987 has led to the gradual phasing out of these chemicals. Non-chlorine-containing fluorocarbons, such as R-134a, which do not possess the long-term stability of R-12, have since received widespread use as refrigerants. It was not realized until the late 1990's, however, that all fluorocarbons, including both R-12 and R-134a, could contribute to global warming.

Thermoelectricity is one alternative climate control technology that does not contain such chemicals and presents many additional advantages, including all-solid-state operation, electronic capacity control, reversibility to provide both heating and cooling, and high reliability. Thermoelectric heat-to-electrical power converters also have potential uses in thermal energy recovery systems. However, thermoelectric cooling has not enjoyed widespread use because of its low efficiency relative to vapor compression systems. The thermoelectric efficiency (or coefficient of performance for a cooler) depends on the thermoelectric figure of merit, Z, of the material of which the thermoelectric device is comprised. This quantity is a combination of the thermoelectric power or Seebeck coefficient S, the electrical conductivity $\sigma$, and the thermal conductivity $\kappa$ of the material:

$$Z = \frac{S^2 \sigma}{\kappa}$$

Currently, the bulk material with the highest thermoelectric figure of merit at room temperature (300 K) is $Bi_2Te_3$ with $Z \approx 0.003$ $K^{-1}$, but an improvement by about a factor of 2 is generally considered to be necessary for thermoelectric devices to be competitive with vapor-compression technology.

One approach to increasing Z is to search for physical systems exhibiting an enhanced thermoelectric power. In 1993, Hicks and Dresselhaus ("Thermoelectric Figure of Merit of a One-Dimensional Conductor", *Physical Review B* Vol. 47, pp. 16631, 1993) pointed out that, due to the quantum-mechanical nature of the motion of electrons through solids, confining such electrons in a structure with a physical dimension below the spatial extent of the electron wavefunction should result in an enhancement of Z. The main mechanism for the enhancement is due to an increase of the density of states near the Fermi level. As a result of the increase, a sufficient density of charge carriers can exist in the solid to maintain the electrical conductivity, but the Fermi energy is small, and this leads to a large S. An enhancement of Z has been observed in superlattices, but the inventors ascribe that effect to a control of the phonon thermal conductivity at the interfaces. Furthermore, superlattices are more suitable for thin-film applications than for large-scale climate control. Stronger increases in Z are predicted in quantum wires because of the additional confinement: the electronic density of states is characterized by the existence of peaks at quantized values of energy. Bismuth is a particularly attractive candidate, because the electronic effective mass is very small in this semimetal, and therefore the spatial extent of the electron wavefunctions is large. Furthermore, its lattice thermal conductivity is small, because it is the heaviest non-radioactive element. According to the theoretical basis for bismuth as a thermoelectric material, Bi nanowires become semiconductors when the diameter is decreased below 50 nm. An enhancement of the figure of merit to a value of ZT=6 (at 77K) is predicted for wires with 5 nm diameters, doped to $10^{18}$ electrons per $cm^3$.

Multiple investigations using bismuth nanowires embedded in porous anodic alumina have followed the first theoretical calculation, mostly based on resistivity measurements. The first thermopower measurements on bismuth nanowires of 200 nm diameter embedded in anodic alumina did not show any enhancements in thermopower. The cause was identified to be the fact that 200 nm was too large a diameter for the nanowire effects to manifest themselves. The thermopower measurements for bulk Bi, 200 nm Bi/anodic alumina composites and an optimized $Bi_2Te_3$ alloy are shown in FIG. 1. The optimized $Bi_2Te_3$ alloy refers to an alloy of four bulk intermetallic compounds, $Bi_2Te_3$, $Bi_2Se_3$, $Sb_2Te_3$ and $Sb_2Se_3$ in accordance with the formula $(Bi_{1-x}Sb_x)_2(Te_{1-y}Se_y)_3$, with one or more dopants.

While the theoretical basis for the increase in S and Z has been developed, verification of these effects has been difficult to realize. The first hurdle is the sample synthesis technique. Molten bismuth has been inserted into porous hosts under very high pressures, but this technique is limited to wires with diameters greater than 40 to 50 nm, because the necessary pressure increases rapidly with decreasing diameter. Nevertheless, this technique has been used to prepare the first wires on which the semimetal/semiconductor transition was reported, as evidenced by magnetoresistance data. A new vapor-phase technique was developed and described in Thrush et al. U.S. Pat. No. 6,159,831 and, because it does not depend on the surface tension of the bismuth/host material interface, it has been used to prepare wires of diameters down to 7 nm. The temperature dependence of the electrical resistance of nanowires of diameters in the 200 nm to 7 nm range, and their magnetoresistance, illustrate the semimetal/semiconductor transition very clearly. Until now, the thermoelectric power was measured only on 200 nm wires embedded in anodic alumina, which are metallic and show no enhancement in S, as expected.

An additional obstacle to the realization of bismuth nanocomposites as a thermoelectric power source is the expense and impracticality of anodic alumina as the host material. Anodic alumina is provided as a thin film material, generally having a thickness less than 2 mil, and more typically on the order of 1 mil (0.0254 mm). These films are expensive, and their small size limits their ability to be used commercially for large-scale climate control.

There is thus a need for a bismuth nanocomposite exhibiting enhanced thermopower that may be practically produced for large-scale climate control applications.

SUMMARY OF THE INVENTION

The present invention provides a thermoelectric material that exhibits enhanced thermoelectric power, and thus an improvement in the thermoelectric figure of merit, thereby providing a commercially viable thermoelectric material for use as a thermoelectric power source. To this end, a bismuth-based material, as elemental bismuth, a bismuth alloy, a bismuth intermetallic compound, a mixture of these, or any of these including a dopant, is embedded in the pores of a porous host material having an average pore size in the range of about 5–15 nm. The host material is advantageously a non-anodic porous alumina, a porous glass or a porous silica-gel, which are available in bulk form. In an exemplary embodiment of the present invention, the host material is non-anodic porous alumina comprising porous $\theta$—$Al_2O_3$ grains having an average pore size of about 9 nm fused together with non-porous $\alpha$—$Al_2O_3$ grains. In another exemplary embodiment, the host material is a porous silica-based material comprising at least about 90% silica having an amorphous or crystalline phase, for example silica-gel having an average pore size of about 15 nm or VYCOR® glass treated to have 5–15 nm pore sizes.

The present invention further provides a method of making a composite thermoelectric material, in which a host material, for example a non-anodic porous alumina, high purity silica glass or silica-gel, is provided having an average pore size of about 5–15 nm, and a vapor of a bismuth-based material is caused to flow into the pores. More specifically, the bismuth-based material is heated to form a vapor, and the vapor is flowed into the pores from a vapor inlet side of the host material to a vapor outlet side.

In an exemplary method, a heater is placed adjacent the vapor outlet side of the host material to heat the host material. The host material is then cooled from the vapor outlet side to progressively condense the vapor in the holes in the direction from the outlet side to the inlet side to progressively form nanowires of the bismuth material in the pores.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
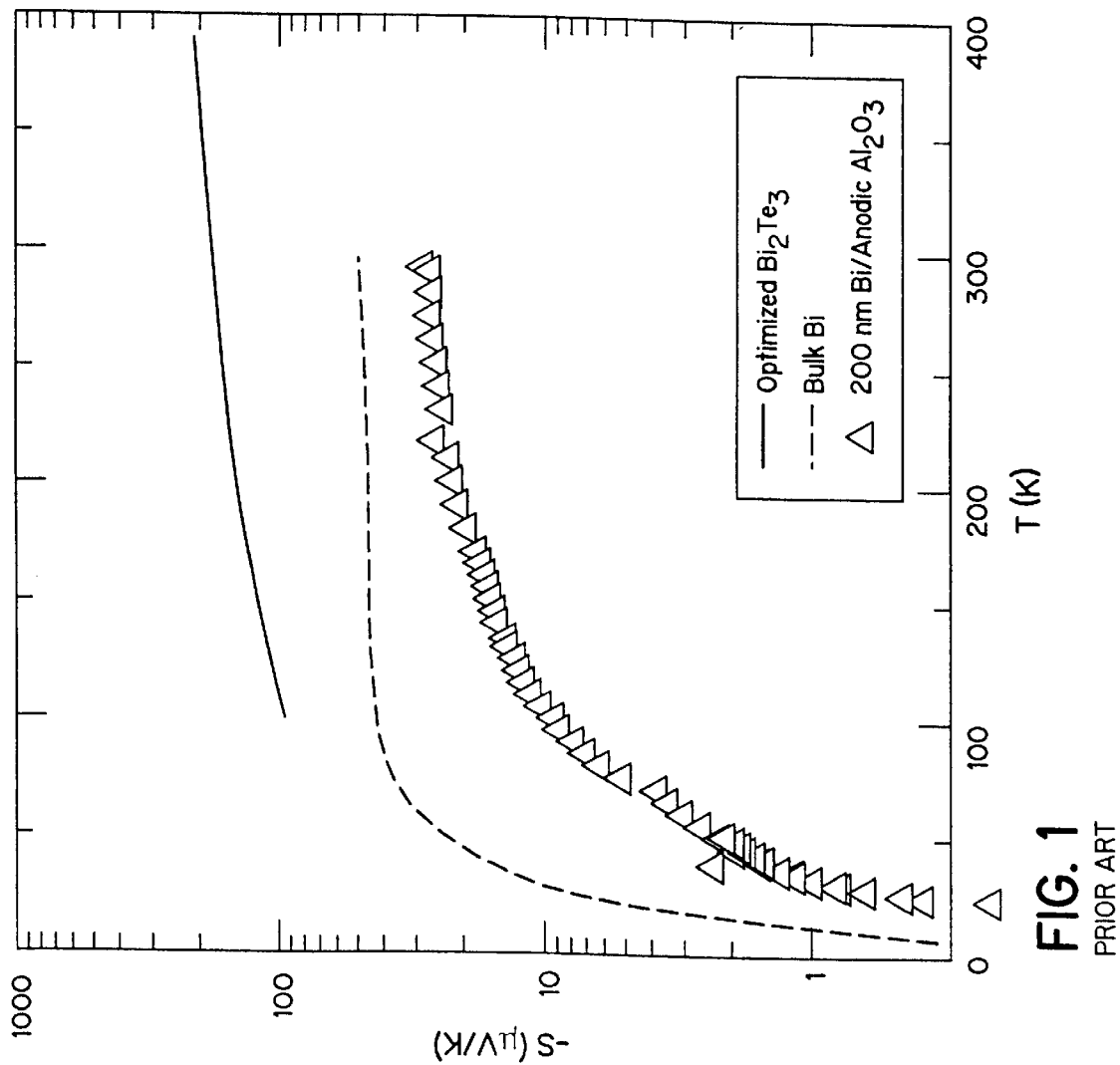
FIG. 1 is a plot of the thermoelectric power as a function of temperature for bulk bismuth, a bulk alloy including a $Bi_2Te_3$ intermetallic compound, and 200 nm bismuth wires embedded in anodic alumina, as known in the prior art.

The present invention provides a composite thermoelectric material comprising bismuth-based nanowires having a diameter of about 5–15 nm embedded in a porous host matrix, and a method of preparing a nanocomposite of a bismuth-based guest material inside a porous host matrix to obtain an enhancement of the thermoelectric power of the composite over that of its constituents. Host materials include for example, porous glass, porous silica-gel and non-anodic porous alumina. Other possible host materials for bismuth nanocomposites include porous zeolites. These host materials are available in bulk form, making them inexpensive and practical alternatives to anodic alumina. The bismuth nanowires formed in the host matrix may comprise pure elemental bismuth, bismuth alloys, bismuth intermetallic compounds, and mixtures thereof. The bismuth-based nanowire material may further include one or more dopants. By way of example and not limitation, possible guest materials include pure bismuth, bismuth alloys, such as $Bi_{1-x}Sb_x$ alloys, $Bi_2Te_3$ compounds, and $(Bi_{1-x}Sb_x)_2(Te_{1-y}Se_y)_3$ alloys, mixtures or solid solutions of these materials, or any of the above-mentioned materials with small quantities (about 10–1000 ppm) of Pb, Sn or Ge as p-type dopants, and/or Te or Se as n-type dopants. For the alloys, x and y generally have a value between 0 and 1.

An obstacle to making a nanocomposite thermoelectric lies in the existence of two competing effects. The first effect, beneficial, is an enhancement in thermoelectric power as wire diameter decreases. As the diameters of the bismuth nanowires decrease, these wires become semiconductors with a progressively larger energy gap, and a progressively larger thermoelectric power. A diameter of 20 nm or less has been theorized to display the desired enhancement in thermopower. The second effect, called localization, is detrimental. Localization happens when electrons in the nanowires interact with obstacles in the wire. In particular, electrons, which are packets of electromagnetic waves in quantum mechanics, have wavefunctions that undergo interferences with these obstacles. A general discussion of localization may be found in Abrikosov, "Fundamentals of the Theory of Metals," pp. 209–232 (1988). Localization does happen in these bismuth nanowires. Localization effects increase the electrical resistance of the wires, and destroy the thermopower. The role of the obstacles is increased as the wire diameters are decreased, because the narrower the wire, the harder it is for electrons to drift by the obstacles. In the present invention, the wire diameters are limited to within a particular size range because we have recognized that the increasing thermopower with decreasing wire diameter will reach a maximum at some wire diameter, and then will begin to decrease. We have thus determined, as will be shown and discussed in more detail below, that wire diameters of about 15 nm or less are needed to obtain enhanced thermopower, and wire diameters of about 5 nm or greater are needed to avoid the detrimental effects of localization.

In a first example of the present invention, commercial 1 mm silica-gel thin-layer chromatography plates, WHAT- MAN® PK5, were used to obtain the host material to produce Bi/silica nanocomposites samples 1 and 2. In the commercial product, a 0.5 mm porous silica-gel layer was applied to a glass backing plate. For the preparation of the Bi/silica nanocomposites, the porous silica-gel layer was first removed from the backing plate. The 0.5 mm thick silica-gel layers have pore sizes of about 15 nm. The porous grains, which have diameters of about 10 $\mu$m, are bonded by an organic binder, which pyrolyzes during the introduction of Bi. Pure bismuth was impregnated into the pores using a vapor technique similar to that disclosed in Thrush et al. U.S. Pat. No. 6,159,831, incorporated by reference herein in its entirety, and discussed in more detail below.

In a second example of the present invention, Bi/alumina nanocomposite samples 1 and 2 were prepared using non-anodic porous alumina as a host material. This type of host material is a bulk material prepared from a slurry of $Al_2O_3$, comprising about 66 wt. % of $\theta$—$Al_2O_3$ grains, 31 wt. % of milled $\alpha$—$Al_2O_3$, and about 3 wt. % aluminum nitrate ($Al(NO_3)_3 \cdot 9H_2O$) binder, based on the total weight of solids. The $\theta$—$Al_2O_3$ grains have a pore size distribution of an approximate Gaussian shape centered around 9 nm with full width at half maximum of about 7 nm. The non-porous $\alpha$—$Al_2O_3$ grains provide mechanical integrity to the samples after preparations. However, because they are electrically insulating, their presence greatly increases the resistance of the sample, thus decreasing Z, and so their content is limited. The slurry was dried and then calcined overnight at 270° C. in air, which drives out the nitrate and fuses the porous $\theta$—$Al_2O_3$ grains to each other with the $\alpha$—$Al_2O_3$ grains. The samples of alumina host material, in the shape of free-standing plates about 0.5 mm thick, were put on top of the crucible in the vacuum chamber, heated, exposed and then slowly cooled in the presence of Bi vapor to impregnate the pores with bismuth in the manner described for the Bi/silica nanocomposite samples.

To introduce the Bi, the 0.5 mm free-standing plates of silica-gel and alumina host material were put on top of a crucible containing bismuth in a cryopumped vacuum chamber. After a brief outgassing period using a heater located on top of the sample, in vacuum near 640±10° C., the samples were held at 590±10° C. in the presence of Bi vapor for 4 minutes, and then cooled slowly. The use of a heater on top of the samples is an improvement to the method described in Thrush et al. U.S. Pat. No. 6,159,831, whereby greater pore filling may be achieved. Cooling occurred in a direction from the vapor outlet side of the plates (the top of the plates) to the vapor inlet side of the plates (the bottom of the plates) whereby the vapor progressively condenses and freezes in each pore from the top of the plates downwardly to the inlet of the pores at the bottom of the plates. For comparison, samples of $SiO_2$ and $Al_2O_3$ were prepared with the pores filled with Zn. Also for comparison, commercially-available high purity porous silica glass, VYCOR® 7930 from Corning, Inc., was used for the host material to produce a Bi/VYCOR® nanocomposite sample. The commercially-available VYCOR® brand porous glass has pore sizes of about 4 nm. The preparation technique for the comparative samples was identical as for the Bi/$SiO_2$ and Bi/$Al_2O_3$ nanocomposite samples of the present invention, except the growth temperature for the Zn composites was started near 480° C. X-ray diffraction measurements were taken on samples that were lapped 0.2 mm deep, so as to avoid peaks generated by metal particles that may remain on the surfaces after the exposure to the vapor.

The spectra on the Bi nanocomposites show the presence of rhombohedral Bi peaks. Similarly, XRD data on the Zn/$Al_2O_3$ samples have peaks corresponding to hexagonal Zn. A cursory line-width analysis using the Scherer formula gives Bi crystallite sizes for the Bi/$SiO_2$ composites of about 20 to 50 nm, and for the Bi/$Al_2O_3$ samples varying from 15 to 50 nm. The discrepancy between these numbers and those obtained by the adsorption technique are believed to reflect the fact that the wires are much longer than wide. Scanning electron microscopy (SEM) was also used to study the structure of the Bi composites. This study did not reveal traces of Bi coating the outer surfaces of the $SiO_2$ or $Al_2O_3$ grains; the metals are absorbed inside the porous grains. Contact between the grains appears to occur via nanowires that extend beyond the grain perimeter. SEM images show wires of diameters at the resolution of the microscope, about 15 nm.

The two samples of the 15 nm Bi/$SiO_2$ nanocomposite of the invention and the two samples of the 9 nm Bi/$Al_2O_3$ nanocomposite of the invention were mounted for thermoelectric power and electrical resistance measurements, as well as the comparative samples. The samples were mounted on a cold platform (made from boron nitride) with silver epoxy or Wood's alloy. A resistive heater was attached to the other face of the sample. By passing current through the heater, a temperature gradient was established. The thermopower of the sample is defined as the ratio of the thermally induced voltage to the thermal gradient. Two different measurement techniques were used on the 15 nm Bi/$SiO_2$ composites, a 2-contact technique and a conventional 4-contact technique, using two absolute copper/constantan thermocouples to measure the temperature gradient. Voltage wires and thermocouples were attached to the heater stage and to the cold platform in the 2-wire technique. Two thermocouples and two voltage wires were attached in the middle of the sample in the 4-wire technique. The 4-contact technique requires no electrical isolation between the thermocouples and the sample, and the copper leg of each thermocouple can be used to probe the electrical potential. The samples were about 2 mm long along the direction of the thermal gradient, with a cross section of 1×0.5 mm². The distance between the thermocouple legs was on the order of 1 mm. Only the 4-contact technique was used on the Bi/VYCOR®, Bi/$Al_2O_3$, Zn/$SiO_2$ and Zn/$Al_2O_3$ composites. All samples were mounted in a liquid helium variable temperature cryostat, and d.c. measurement techniques were used. The sample resistance was measured using positive and negative currents, and the voltage was measured using a Keithley 617 electrometer, with a $10^{14}$ Ω input impedance. The thermoelectric power was measured by applying a temperature gradient using the resistive heater, waiting for it to stabilize, and measuring the temperature and voltage gradients. Again, the electrometer was used to measure the voltage, and, insofar as the sample resistance was low enough to permit it, the measurements were repeated using a Keithley 182 nanovoltmeter having an input impedance of $10^{10}$ Ω.

Figure 2:
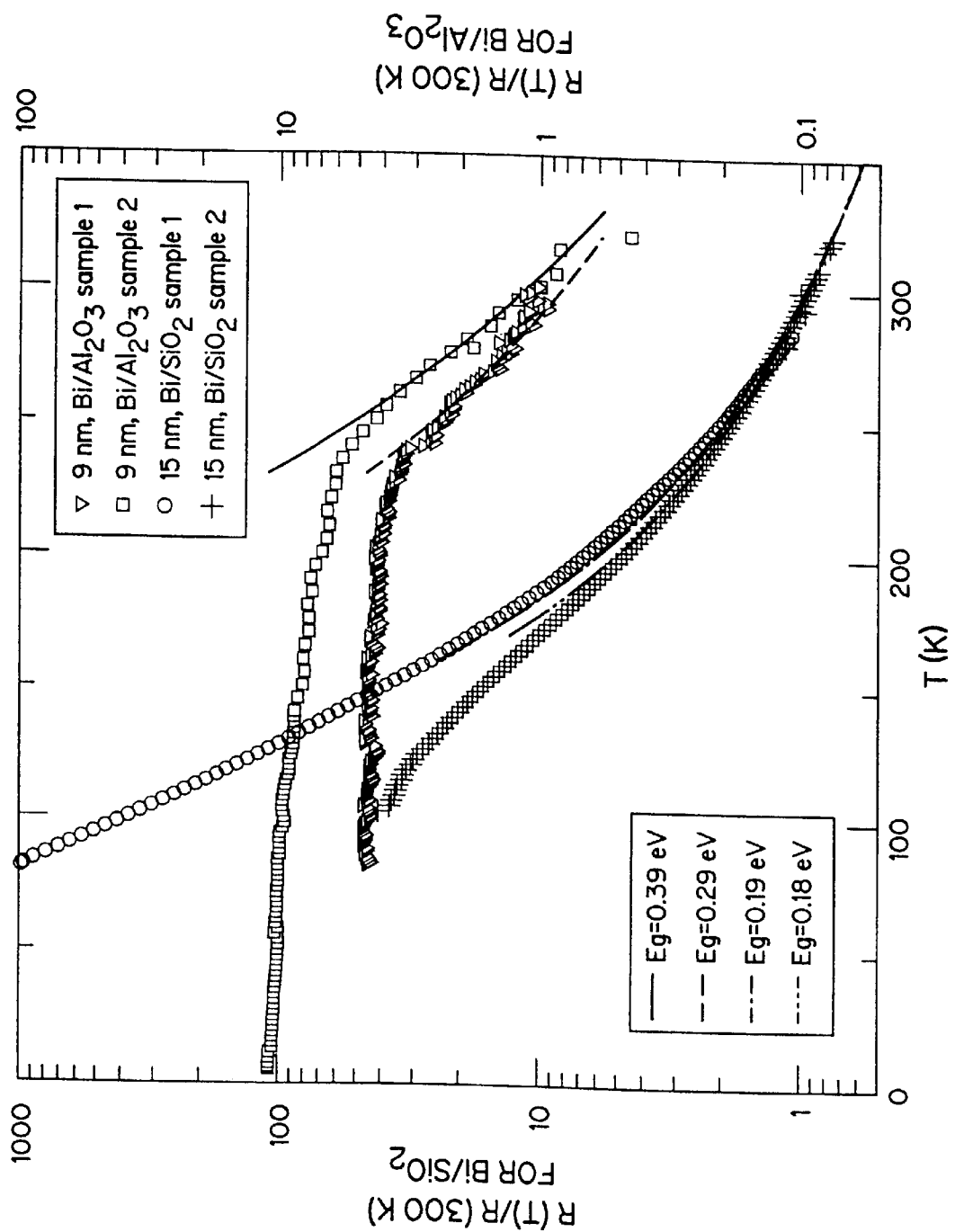
FIG. 2 is a plot of the temperature dependence of the resistance of samples of the present invention, normalized to the resistance at 300 K.
Figure 4:
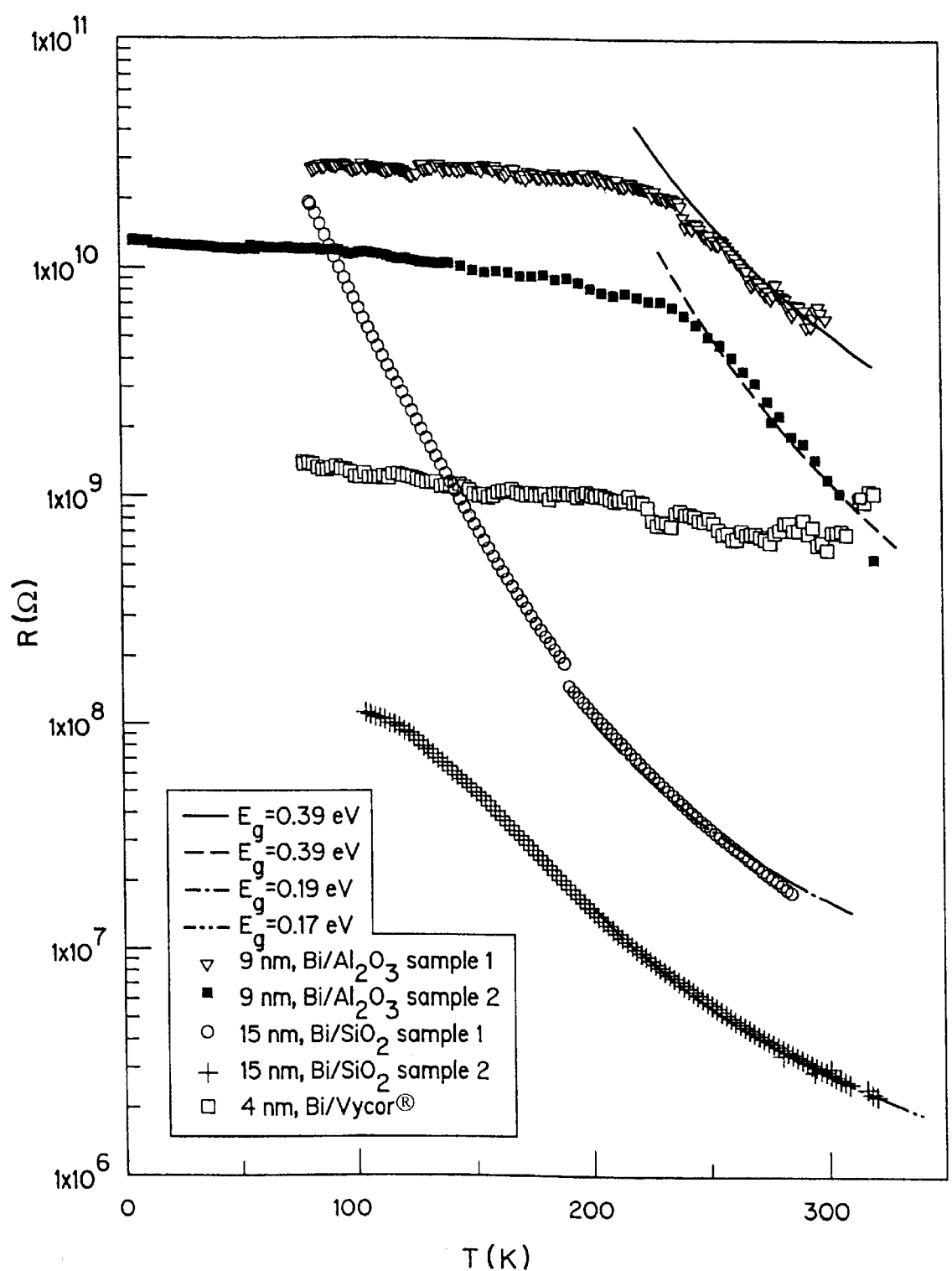
FIG. 4 is a plot of the temperature dependence of the resistance of bismuth nanocomposites of the present invention and a bismuth/VYCOR® glass sample for comparative purposes.

The temperature dependence of the resistance of the samples of the invention, normalized to the resistance at 300 K, is shown in FIG. 2. As the filling fraction of the host alumina and silica materials is unknown, we cannot deduce an intrinsic resistivity. Generally, the sample resistance shows an activated behavior at high temperature, following an equation that reflects the temperature dependence of the intrinsic electron density in a semiconductor:

$$R(T) R_0 \cdot \exp(E_g/2k_BT)$$

wherein $E_g$ is the energy gap and $k_B$ is the Boltzmann constant. The solid and dashed lines in FIG. 2 are fits of the high-temperature data to the R(T) equation for the 4 $SiO_2$ and $Al_2O_3$ samples studied. The value of $E_g$ for the 15 nm $Bi/SiO_2$ composites is on the order of 0.18–0.19 eV, and on the order of 0.29 eV and 0.39 eV for the 9 nm $Bi/Al_2O_3$ composites. The 4 nm Bi/VYCOR® comparative sample does not have an activated behavior, as shown in FIG. 4 discussed below, but has the characteristic temperature dependence of one-dimensional localization. Assuming that the samples consist of mainly trigonal quantum wires at an average temperature of 250 K, calculated theoretical $E_g$'s are $E_g \approx 0.23$ eV for 15 nm Bi wires, and $E_g \approx 0.47$ eV for 9 nm Bi wires. For wires along the bisectrix direction, the numbers are: $E_g \approx 0.07$ eV for 15 nm Bi wires and $E_g \approx 0.2$ eV for 9 nm Bi wires. Given the polycrystalline nature of the samples, the experimental data is expected to fall in between, and the agreement is quite reasonable.

Figure 3:
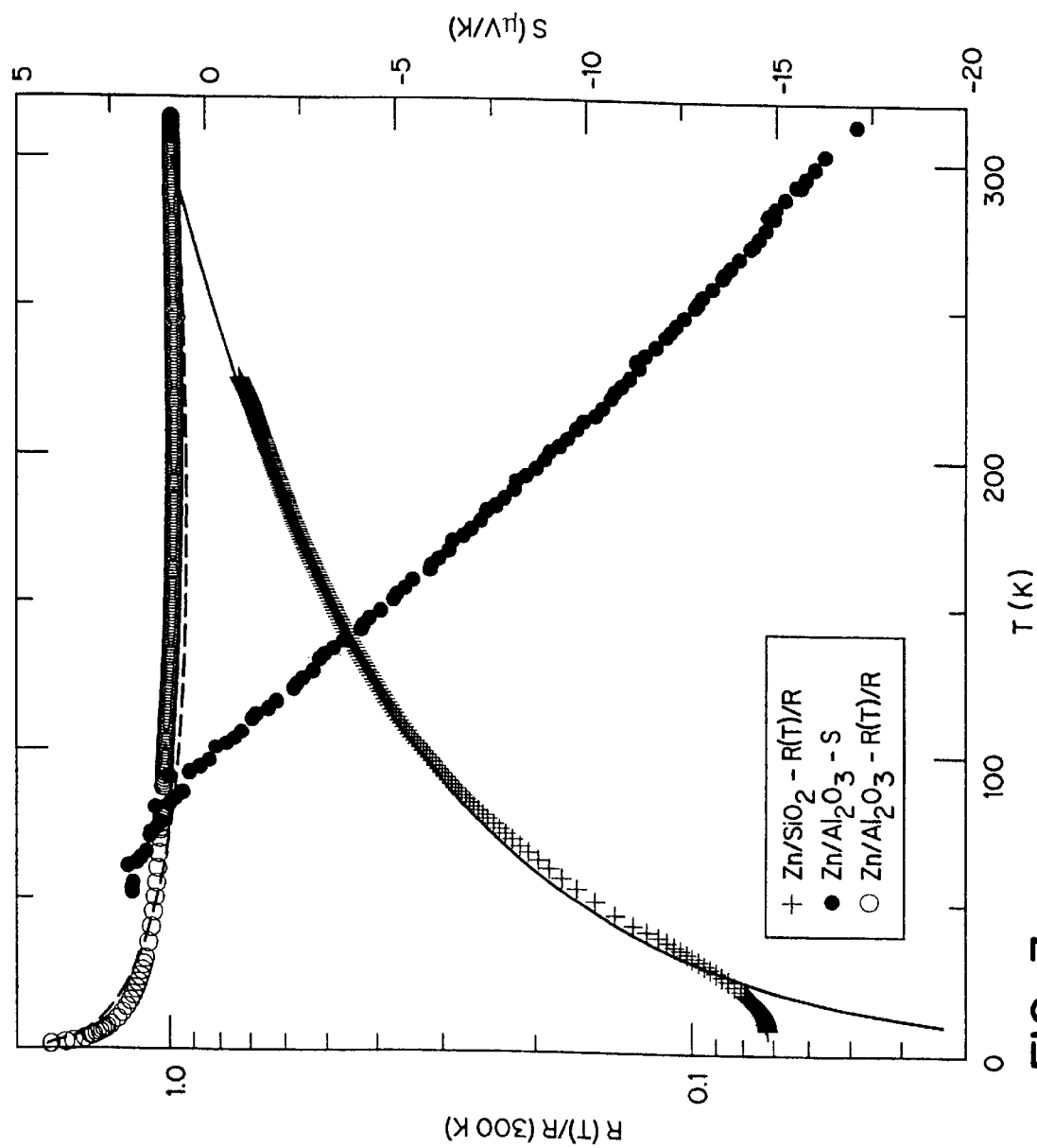
FIG. 3 is a plot of the temperature dependence of the resistance of zinc nanocomposites, normalized to the resistance at 300 K, on the left ordinate, and of the thermoelectric power for a zinc nanocomposite embedded in porous alumina on the right ordinate.

FIG. 3 shows the temperature dependence of the resistance of the comparative Zn nanocomposite samples, normalized to the resistance at 300 K. The latter is R(300 K)=1.7 kΩ for the $Zn/Al_2O_3$ sample, and R(300 K)=0.48 Ω for the $Zn/SiO_2$ sample. The resistance of the 15 nm $Zn/SiO_2$ nanocomposite follows a $T^1$ law shown as a fall line, characteristic of a metal. The resistance of the 9 nm diameter $Zn/Al_2O_3$ nanocomposite is also fit by a full line showing the sum of a $T^1$ law, which dominates at high temperature, and a $T^{-1/2}$ law characteristic of localization. There is no evidence of exponential behavior of the resistance in the case of the Zn wires. This is believed to indicate that the behavior reported here for the Bi nanocomposites of the invention is due to their semiconducting nature.

FIG. 4 shows the temperature dependence of the resistance without normalization for 15 nm $Bi/SiO_2$ and 9 nm $Bi/Al_2O_3$ nanocomposites of the present invention and the comparative 4 nm Bi/VYCOR® sample. FIG. 4 shows that the exponential decrease of resistance at high temperature present with the samples of the present invention is absent in the 4 nm Bi/VYCOR® comparative sample. While the samples of the present invention having the 9 nm and 15 nm nanowires follow the $\exp(E_g/2k_BT)$ law indicative of semiconductor behavior, the 4 nm size nanowires begin to display effects of localization that counteract the enhancement in thermoelectric power, which is detrimental to the use of the material as a thermoelectric power source.

Figure 5:
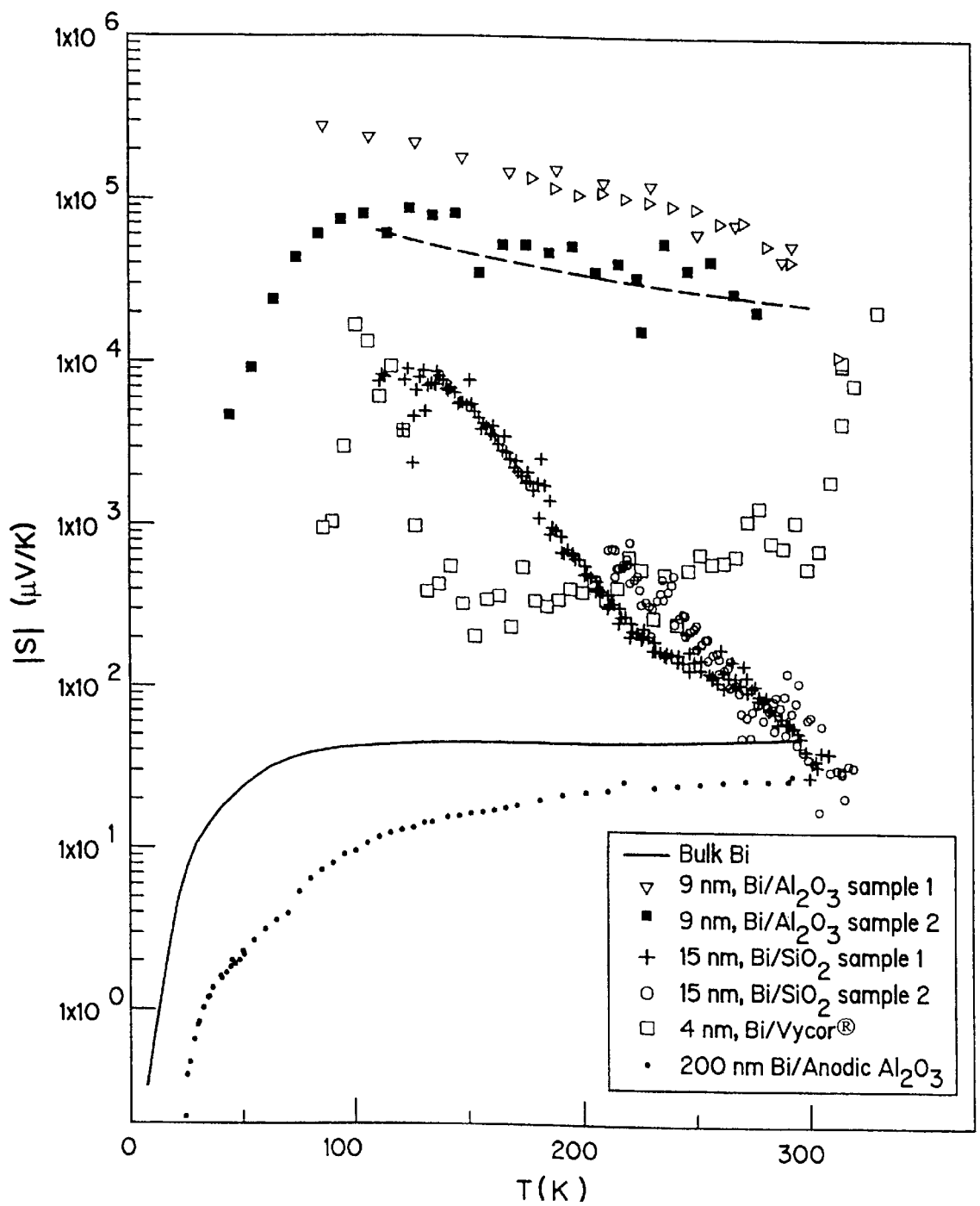
FIG. 5 is a plot of the absolute value of the thermoelectric power as a function of temperature for the samples of the present invention and the prior art comparative samples.

The absolute value of the thermoelectric power of the Bi nanocomposites of the invention is shown in FIG. 5, along with the thermoelectric power of the comparative samples of bulk Bi, 200 nm Bi wires in anodic alumina, and 4 nm Bi/VYCOR® wires. The temperature dependence of the thermoelectric power in the data for the bulk Bi and 200 nm wires is metallic, while the nanocomposites of the invention are semiconductors, as shown in FIG. 2. A substantial increase in the magnitude of the thermoelectric power is observed in the nanocomposite samples, compared to that of the bulk samples. This behavior is consistent with theory describing a sharply peaked density of states, with the Fermi energy located near the energy of the peak. A consequence of this quantization, a strongly enhanced thermoelectric power, is demonstrated experimentally for the first time here; this validates the approach of using nanostructures to enhance the thermoelectric figure of merit. The thermoelectric power of the $Bi/Al_2O_3$ samples follows a $T^{-1}$ law, as shown as a dashed line in FIG. 5. This behavior is expected both in intrinsic semiconductors and in mesoscopic systems. It may be appreciated that the sign and the absolute value of the thermoelectric power depend on the details of energy dependence of the density of states (subject to broadening by imperfections) and on the nature of the scattering mechanism. The thermoelectric power of the $Bi/SiO_2$ nanocomposites decreases much more rapidly with temperature, indicating additional temperature-dependent mechanisms, such as the co-existence of electrons and holes. For comparison, we report in FIG. 3 the thermoelectric power of the 9 nm $Zn/Al_2O_3$ composites. It is almost an order of magnitude larger than that of bulk Zn. However, as the thermoelectric power has a linear temperature dependence with a value <20 μV/K, it remains consistent with metallic conduction in that system.

In summary, an experimental study of the resistance and the thermoelectric power of 15 nm $Bi/SiO_2$ and 9 nm $Bi/Al_2O_3$ nanocomposites show a very large increase in thermoelectric power. The temperature dependence of both the resistance and the thermoelectric power of the nanocomposites are characteristic of a semiconductor, unlike the previously reported behavior of 200 nm diameter Bi nanowires, which are metallic. The present results constitute the first experimental confirmation of the concept of using one-dimensional quantum confinement to increase the thermoelectric power, and therefore the figure of merit, of thermoelectric materials. Zn-filled nanocomposites prepared for comparison using the same techniques and the same porous host materials remain metallic, and show the influence of localization effects.

In addition, the comparative Bi/VYCOR® samples indicate the detrimental effect of localization in wires having a 4 nm diameter. The 9 nm bismuth nanocomposites of the present invention have optimum results as a thermoelectric material. The 15 nm bismuth nanocomposites exhibit a large increase in thermoelectric power as compared to the 200 nm wires, the bulk bismuth, and the optimized $Bi_2Te_3$, yet begin to exhibit a decrease in the enhancement effect as wire diameter increases. Thus, the bismuth nanocomposites advantageously have a diameter in the range of about 5–15 nm for exhibiting enhanced thermoelectric power enabling the thermoelectric material to be used in large-scale power source and cooling applications. At diameter sizes above about 15 nm, the enhancement in thermoelectric power, if it exists, is not of a large enough magnitude to enable the materials to be used in thermoelectric power applications. At diameter sizes below about 5 nm, localization effects begin to destroy the thermoelectric power enhancement, again making the material unusable as a thermoelectric power source from a practical standpoint. Moreover, the non-anodic porous alumina, silica glass and silica-gel host materials provide desirable pore sizes while further providing a bulk source to enable use in large-scale climate control applications.

It may be understood that the samples tested contained pure elemental bismuth as the guest material embedded in the host material, which may not represent the optimum material system for maximizing the enhancement of the thermoelectric figure of merit. The thermoelectric figure of merit of the nanocomposite may be further enhanced by the use of dopants, such as Te, Se, Ge, Pb and Sn dopants, in an amount, for example, of about 10–1000 ppm. Similarly, $Bi_{1-x}Sb_x$ alloys, $(Bi_{1-x}Sb_x)_2(Te_{1-y}Se_y)_3$ alloys and $Bi_2Te_3$ intermetallic compounds with or without dopants (Te, Se, Ge, Pb, Sn) may also enhance thermoelectric power of the 5–15 nm nanocomposites. For the alloys, x and y generally have a value between 0 and 1. Other bismuth-based alloys and intermetallic compounds than those specifically mentioned herein may be used without departing from the scope or spirit of the present invention. Similarly, mixtures and solid solutions of alloys and intermetallic compounds may be used. In any desired bismuth-based material system, dopants may be added such as Te, Se, Ge, Pb and Sn. The present invention is therefore not limited to a particular bismuth material system for the nanowires.

In addition, the non-anodic porous alumina and porous silica-gel which are producible in bulk form, with pore sizes of about 5–15 nm, a thermoelectric material is produced which may be used cost effectively in both small-scale and large-scale power source applications, in particular for replacing vapor compression systems. It may be understood, however, that the host material is not limited to these particular materials. For example, while commercially-available VYCOR® glass has an average pore size of about 4 nm, the glass maybe treated to create pore sizes within the 5–15 nm range of the present invention. Thus, porous silica-based materials may be used, for example, glasses having a high silica content of at least about 90%, where the silica is an amorphous phase or a crystalline phase, provided the silica-based material has pore sizes in the range of about 5–15 nm. Advantageously, the host material has a thickness of at least about 0.1 mm, for example about 0.1–1.0 mm, to enable the composite material to provide sufficient thermopower for large-scale power source and cooling applications.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A thermoelectric material comprising bismuth-based nanowires having an average diameter in the range of about 5-15 nm embedded in a non-anodic porous host material wherein the host material is porous alumina comprising porous θ—$Al_2O_3$ grains fused together with non-porous α—$Al_2O_3$ grains.

2. The thermoelectric material of claim 1, wherein the porous θ—$Al_2O_3$ grains have an average pore size of about 9 nm.

3. The thermoelectric material of claim 1 wherein the host material has a thickness of at least about 0.1 mm.

4. The thermoelectric material of claim 1 wherein the bismuth-based nanowires comprise an intermetallic compound of $Bi_2Te_3$.

5. The thermoelectric material of claim 4 wherein the intermetallic compound is doped with one or more elements selected from the group consisting of Te, Se, Ge, Pb and Sn.

6. A thermoelectric material comprising bismuth-based nanowires having an average diameter in the range of about 5-15 nm embedded in a non-anodic porous host material wherein the bismuth-based nanowires comprise an alloy of $Bi_{1-x}Sb_x$ wherein $0<x<1$.

7. The thermoelectric material of claim 6 wherein the host material is porous silica-based material comprising at least about 90% silica, wherein the silica is an amorphous phase or a crystalline phase.

8. The thermoelectric material of claim 6 wherein the host material is porous alumina comprising porous θ—$Al_2O_3$ grains fused together with non-porous α—$Al_2O_3$ grains.

9. The thermoelectric material of claim 8, wherein the porous θ—$Al_2O_3$ grains have an average pore size of about 9 nm.

10. A thermoelectric material comprising bismuth-based nanowires having an average diameter in the range of about 5-15 nm embedded in a non-anodic porous host material wherein the bismuth-based nanowires comprise an alloy of $(Bi_{1-x}Sb_x)_2(Te_{1-y}Se_y)_3$ wherein $0<x<1$ and $0<y<1$.

11. The thermoelectric material of claim 10 wherein the alloy is doped with one or more elements selected from the group consisting of Te, Se, Ge, Pb and Sn.

12. The thermoelectric material of claim 10 wherein the host material is porous alumina comprising porous θ—$Al_2O_3$ grains fused together with non-porous α—$Al_2O_3$ grains.

13. The thermoelectric material of claim 12, wherein the porous θ—$Al_2O_3$ grains have an average pore size of about 9 nm.

14. The thermoelectric material of claim 10 wherein the host material is porous silica-based material comprising at least about 90% silica, wherein the silica is an amorphous phase or a crystalline phase.

15. A thermoelectric material comprising:

a porous host material having an average pore size in the range of about 5-15 nm and selected from the group consisting of non-anodic porous alumina and porous silica-based material; and bismuth-based nanowires embedded in the pores of the host material, and selected from the group consisting of: an alloy of $Bi_{1-x}Sb_x$ wherein $0 \leq x \leq 1$, an alloy of $(Bi_{1-x}Sb_x)_2(Te_{1-y}Se_y)_3$ wherein $0<x<1$ and $0<y<1$ and an intermetallic compound of $Bi_2Te_3$.

16. The thermoelectric material of claim 15 wherein the host material is porous alumina comprising porous θ—$Al_2O_3$ grains fused together with non-porous α—$Al_2O_3$ grains.

17. The thermoelectric material of claim 16, wherein the porous θ—$Al_2O_3$ grains have an average pore size of about 9 nm.

18. The thermoelectric material of claim 15 wherein the host material is porous silica-based material comprising at least about 90% silica, wherein the silica is an amorphous phase or a crystalline phase.

19. The thermoelectric material of claim 15 wherein the host material has a thickness of at least about 0.1 mm.

20. The thermoelectric material of claim 15 wherein the bismuth-based nanowires comprise an alloy of $Bi_{1-x}Sb_x$ wherein $0<x<1$.

21. The thermoelectric material of claim 15 wherein the bismuth-based nanowires comprise an alloy of $(Bi_{1-x}Sb_x)_2(Te_{1-y}Se_y)_3$ wherein $0<x<1$ and $0<y<1$.

22. The thermoelectric material of claim 21 wherein the alloy is doped with one or more elements selected from the group consisting of Te, Se, Ge, Pb and Sn.

23. The thermoelectric material of claim 15 wherein the bismuth-based nanowires comprise an intermetallic compound of $Bi_2Te_3$.

24. The thermoelectric material of claim 23 wherein the intermetallic compound is doped with one or more elements selected from the group consisting of Te, Se, Ge, Pb and Sn.

* * * * *